(12) United States Patent
Krieg et al.

(10) Patent No.: US 12,199,317 B2
(45) Date of Patent: Jan. 14, 2025

(54) BATTERY SYSTEM, METHOD FOR DIAGNOSING A BATTERY SYSTEM, AND MOTOR VEHICLE

(71) Applicant: Robert Bosch GmbH, Stuttgart (DE)

(72) Inventors: Berengar Krieg, Gerlingen (DE); Chrysanthos Tzivanopoulos, Remseck Am Neckar (DE); Johannes Swoboda, Stuttgart (DE); Thomas Schaedlich, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 596 days.

(21) Appl. No.: 17/530,516

(22) Filed: Nov. 19, 2021

(65) Prior Publication Data
US 2022/0158314 A1 May 19, 2022

(30) Foreign Application Priority Data
Nov. 19, 2020 (DE) .......................... 102020214562.8

(51) Int. Cl.
*H01M 50/569* (2021.01)
*G01R 31/371* (2019.01)
(Continued)

(52) U.S. Cl.
CPC ........ *H01M 50/569* (2021.01); *G01R 31/371* (2019.01); *G01R 31/382* (2019.01);
(Continued)

(58) Field of Classification Search
CPC .. H01M 50/569; H01M 10/482; H02J 7/0047; G01R 31/371; G01R 31/382
See application file for complete search history.

(56) References Cited

U.S. PATENT DOCUMENTS 7,834,635 B2 * 11/2010 Oosawa .................. B60L 58/18
324/434
10,594,146 B2 * 3/2020 Shibata ................. H02J 7/0036
(Continued)

FOREIGN PATENT DOCUMENTS

| CN | 102830351 A | 12/2012 |
| DE | 102017218732 A1 | 4/2019 |
| DE | 102019217056 A1 | 5/2021 |

*Primary Examiner* — Richard V Muralidar
(74) *Attorney, Agent, or Firm* — Michael Best & Friedrich LLP

(57) ABSTRACT

A battery system having a battery pack with a negative pole, a positive pole and a battery cell, a coupling network having a first negative terminal and a first positive terminal, a pack voltage divider, and a coupling voltage divider. The first positive terminal is connectable to the positive pole via a switch. Optionally, the first negative terminal is connectable to the negative pole via a switch. The pack voltage divider includes a two resistors connected between the positive pole and a first reference point. A negative pack measurement resistor and a negative sub-pack measurement resistor are dis-connectable from the negative pole or the first reference point via a switch. A positive coupling measurement resistor and a positive sub-coupling measurement resistor are connected between the first positive terminal and the first reference point. Two resistors are connected between the first negative terminal and the first reference point.

13 Claims, 4 Drawing Sheets

(51) Int. Cl.
*G01R 31/382* (2019.01)
*H01M 10/48* (2006.01)
*H02J 7/00* (2006.01)

(52) U.S. Cl.
CPC ......... *H01M 10/482* (2013.01); *H02J 7/0047* (2013.01); *H01M 2220/20* (2013.01)

(56) References Cited

U.S. PATENT DOCUMENTS

| | | | |
|---|---|---|---|
| 10,854,405 B2* | 12/2020 | Ao | B60L 58/10 |
| 10,928,459 B2* | 2/2021 | Sun | G01R 31/389 |
| 11,095,136 B2* | 8/2021 | Geng | H01M 10/4257 |
| 2018/0240629 A1 | 8/2018 | Ao | |
| 2019/0064280 A1 | 2/2019 | Sun et al. | |
| 2020/0161718 A1* | 5/2020 | Genannt Berghegger | G01R 31/3842 |
| 2023/0073493 A1* | 3/2023 | Tzivanopoulos | G01R 31/396 |
| 2024/0103087 A1* | 3/2024 | Lander | G01R 31/3835 |
| 2024/0174129 A1* | 5/2024 | Tzivanopoulos | B60L 58/18 |

\* cited by examiner

BATTERY SYSTEM, METHOD FOR DIAGNOSING A BATTERY SYSTEM, AND MOTOR VEHICLE

BACKGROUND OF THE INVENTION

The invention relates to a battery system comprising at least one battery pack that has a negative pole, a positive pole and at least one battery cell, at least one coupling network that has a first negative terminal and a first positive terminal, a pack voltage divider and a coupling voltage divider, wherein the first positive terminal is able to be connected to the positive pole by way of a positive main switch and/or the first negative terminal is able to be connected to the negative pole by way of a negative main switch, wherein the pack voltage divider comprises a positive pack measurement resistor and a positive sub-pack measurement resistor that are connected in series with one another between the positive pole and a first reference point and are able to be disconnected from the positive pole or the first reference point by way of a positive pack measurement switch, and a negative pack measurement resistor and a negative sub-pack measurement resistor that are connected in series with one another between the negative pole and the first reference point and are able to be disconnected from the negative pole or the first reference point by way of a negative pack measurement switch, and wherein the coupling voltage divider comprises a positive coupling measurement resistor and a positive sub-coupling measurement resistor that are connected in series with one another between the first positive terminal and the first reference point, and a negative coupling measurement resistor and a negative sub-coupling measurement resistor that are connected in series with one another between the first negative terminal and the first reference point. The invention also relates to a method for diagnosing a battery system proposed according to the invention, and to a motor vehicle that comprises the battery system according to the invention and/or that is configured to perform the method according to the invention.

It has become apparent that increasing use will be made of electrically driven motor vehicles in the future. Such electric vehicles use rechargeable batteries, primarily in order to supply electrical drive devices with electrical energy. Lithium-ion battery cells are particularly suitable for such applications. Lithium-ion battery cells are distinguished, inter alia, by high energy densities, thermal stability and extremely low self-discharging.

A battery pack comprises a multiplicity of such lithium-ion battery cells, which may be electrically connected to one another both in series and in parallel. Such a battery pack has an output voltage in the range of for example 400 V to 800 V, this being present between a positive pole and a negative pole. Provision is also made for a management system that monitors the operation of the battery pack and controls it such that the battery cells are operated reliably and sustainably in terms of their service life.

In particular, a voltage measurement on the battery pack is necessary. On account of the comparatively high output voltage of the battery pack, a direct voltage measurement between the poles of the battery pack is difficult. The comparatively high output voltage may for example be measured by way of galvanic isolation. It is also known to provide voltage dividers between the poles of a battery pack, these voltage dividers comprising a multiplicity of series-connected resistors. Measuring the partial voltages dropped across the individual resistors then makes it possible to calculate the output voltage of the battery pack.

Document CN 102830351 A discloses an apparatus for monitoring the state of and diagnosing faults with a high-voltage switch. The apparatus comprises a monitoring unit and a control unit, wherein a negative connection of a DC voltage source connected to the high-voltage switch is selected as reference point for the voltage measurement.

SUMMARY OF THE INVENTION

What is proposed is a battery system. The battery system in this case comprises at least one battery pack that has a negative pole, a positive pole and at least one battery cell. The battery system furthermore comprises at least one coupling network that has a first negative terminal and a first positive terminal. The battery system furthermore comprises a pack voltage divider and a coupling voltage divider. In this case, the first positive terminal is able to be connected to the positive pole by way of a positive main switch and/or the first negative terminal is able to be connected to the negative pole by way of a negative main switch. The main switches are designed for example in the form of electromechanical relays or contactors. If the battery system has a plurality of battery packs, the battery system may have a plurality of pack voltage dividers that are each assigned to a battery pack. If the battery system has a plurality of coupling networks, the battery system may have a plurality of coupling voltage dividers that are each assigned to a coupling network.

The battery pack preferably has a multiplicity of battery cells that are connected in series between the positive pole and the negative pole. The battery cells together deliver a pack voltage of for example 400 V, which is present between the positive pole and the negative pole of the battery pack.

The pack voltage divider in this case has a positive pack measurement resistor and a positive sub-pack measurement resistor that are connected in series with one another between the positive pole and a first reference point and are able to be disconnected from the positive pole or the first reference point by way of a positive pack measurement switch. The pack voltage divider furthermore has a negative pack measurement resistor and a negative sub-pack measurement resistor that are connected in series with one another between the negative pole and the first reference point and are able to be disconnected from the negative pole or the first reference point by way of a negative pack measurement switch. The first reference point in this case constitutes a floating reference potential for a voltage measurement. The pack measurement switches are designed for example in the form of MOSFETs or relays.

Using the positive as well as the negative pack measurement switch guarantees, on the one hand, that the battery cannot discharge in the switched-off state. On the other hand, the distortion of the voltage divider changes the expected measured voltage.

The positive pack measurement resistance is in this case proportionately greater than the positive sub-pack measurement resistance. The negative pack measurement resistance is in this case proportionately greater than the negative sub-pack measurement resistance. The ratio between the positive pack measurement resistance and the positive sub-pack measurement resistance may for example be 1000. The ratio between the negative pack measurement resistance and the negative sub-pack measurement resistance may for example likewise be 1000.

A positive pack measured voltage dropped across the positive sub-pack measurement resistor may be measured by a high-voltage measurement channel. Likewise, a negative pack measured voltage dropped across the negative sub-pack measurement resistor may be measured by a high-voltage measurement channel. Since the positive pack measurement resistance is proportionally greater than the positive sub-pack measurement resistance and the negative pack measurement resistance is proportionally greater than the negative sub-pack measurement resistance, the respective pack measured voltages may be measured with appropriate scaling. By way of example, it is possible to scale voltages in a range from −1000 V to +1000 V to a range of 0 to 5 V and to measure the latter, wherein a measured voltage of 2.5 V corresponds to an actual voltage of 0 V.

The at least one coupling network is used for example to connect the battery system to an on-board power system of an electric vehicle. The at least one coupling network preferably also has an intermediate circuit capacitor that is connected between the first positive terminal and the first negative terminal.

The coupling voltage divider in this case has a positive coupling measurement resistor and a positive sub-coupling measurement resistor that are connected in series with one another between the first positive terminal and the first reference point. The coupling voltage divider furthermore has a negative coupling measurement resistor and a negative sub-coupling measurement resistor that are connected in series with one another between the first negative terminal and the first reference point.

The positive coupling measurement resistance is in this case proportionately greater than the positive sub-coupling measurement resistance. The negative coupling measurement resistance is in this case proportionately greater than the negative sub-coupling measurement resistance. The ratio between the positive coupling measurement resistance and the positive sub-coupling measurement resistance may for example be 1000. The ratio between the negative coupling measurement resistance and the negative sub-coupling measurement resistance may for example likewise be 1000.

A positive coupling measured voltage dropped across the positive sub-coupling measurement resistor may be measured by a high-voltage measurement channel. Likewise, a negative coupling measured voltage dropped across the negative sub-coupling measurement resistor may be measured by a high-voltage measurement channel.

According to the invention, the battery system comprises a positive main fuse and a first positive auxiliary voltage divider for diagnosing the positive main fuse and/or a negative main fuse and a first negative auxiliary voltage divider for diagnosing the negative main fuse. In this case, the positive main fuse is connected between the positive main switch and the first positive terminal. In this case, the first positive auxiliary voltage divider comprises a positive main fuse measurement resistor and a positive sub-main fuse measurement resistor that are connected in series with one another between a first connection of the positive main fuse, which is connected to the positive main switch, and the first reference point. The negative main fuse is in this case connected between the negative main switch and the first negative terminal. The first negative auxiliary voltage divider in this case comprises a negative main fuse measurement resistor and a negative sub-main fuse measurement resistor that are connected in series with one another between a first connection of the negative main fuse, which is connected to the negative main switch, and the first reference point.

A first positive auxiliary measured voltage dropped across the positive sub-main fuse measurement resistor may be measured by a high-voltage measurement channel. Likewise, a first negative auxiliary measured voltage dropped across the negative sub-main fuse measurement resistor may be measured by a high-voltage measurement channel.

According to one preferred embodiment of the invention, a resistance ratio of the pack voltage divider differs from a resistance ratio of the coupling voltage divider. The resistance ratio of the pack voltage divider in this case corresponds to a ratio of a sum of the positive pack measurement resistance and the positive sub-pack measurement resistance to a sum of the negative pack measurement resistance and the negative sub-pack measurement resistance. The resistance ratio of the coupling voltage divider in this case corresponds to a ratio of a sum of the positive coupling measurement resistance and the positive sub-coupling measurement resistance to a sum of the negative coupling measurement resistance and the negative sub-coupling measurement resistance.

Since the positive pack measurement resistance is proportionally greater than the positive sub-pack measurement resistance and the negative pack measurement resistance is proportionally greater than the negative sub-pack measurement resistance, the resistance ratio of the pack voltage divider in this case corresponds approximately to a ratio of the positive pack measurement resistance to the negative pack measurement resistance.

Since the positive coupling measurement resistance is proportionally greater than the positive sub-coupling measurement resistance and the negative coupling measurement resistance is proportionally greater than the negative sub-coupling measurement resistance, the resistance ratio of the coupling voltage divider in this case corresponds approximately to a ratio of the positive coupling measurement resistance to the negative coupling measurement resistance.

At least one coupling network preferably has a second positive terminal and/or a second negative terminal for connecting the battery system to a charger, such as for example a vehicle charger. In this case, the battery system may comprise a positive charging fuse and a second positive auxiliary voltage divider for diagnosing the positive charging fuse and/or a negative charging fuse and a second negative auxiliary voltage divider for diagnosing the negative charging fuse. In this case, the positive charging fuse is connected between the second positive terminal and the first positive terminal and the negative charging fuse is in this case connected between the second negative terminal and the first negative terminal. The second positive auxiliary voltage divider in this case comprises a positive charging fuse measurement resistor and a positive sub-charging fuse measurement resistor that are connected in series with one another between the second positive terminal and the first reference point. The second negative auxiliary voltage divider in this case comprises a negative charging fuse measurement resistor and a negative sub-charging fuse measurement resistor that are connected in series with one another between the second negative terminal and the first reference point.

A second positive auxiliary measured voltage dropped across the positive sub-charging fuse measurement resistor may be measured by a high-voltage measurement channel. Likewise, a second negative auxiliary measured voltage dropped across the negative sub-charging fuse measurement resistor may be measured by a high-voltage measurement channel.

The battery system proposed according to the invention preferably furthermore comprises a fast-charging network that has a negative charging connection and a positive charging connection, and also a charging voltage divider. The positive charging connection is in this case able to be connected to the first positive terminal by way of a positive charging switch and/or the negative charging connection is able to be connected to the first negative terminal by way of a negative charging switch. The charging voltage divider in this case comprises a positive charging measurement resistor and a positive sub-charging measurement resistor that are connected in series with one another between the positive fast-charging connection and the first reference point, and a negative charging measurement resistor and a negative sub-charging measurement resistor that are connected in series between the negative charging connection and the first reference point. The charging switches are designed for example in the form of electromechanical relays or contactors.

The positive charging measurement resistance is in this case proportionately greater than the positive sub-charging measurement resistance. The negative charging measurement resistance is in this case proportionately greater than the negative sub-charging measurement resistance. The ratio between the positive charging measurement resistance and the positive sub-charging measurement resistance may for example be 1000. The ratio between the negative charging measurement resistance and the negative sub-charging measurement resistance may for example likewise be 1000.

According to one preferred embodiment of the invention, a resistance ratio of the charging voltage divider differs from a resistance ratio of the pack voltage divider. The resistance ratio of the charging voltage divider in this case corresponds to a ratio of a sum of the positive charging measurement resistance and the positive sub-charging measurement resistance to a sum of the negative charging measurement resistance and the negative sub-charging measurement resistance.

Since the positive charging measurement resistance is proportionally greater than the positive sub-charging measurement resistance and the negative charging resistance is proportionally greater than the negative sub-charging resistance, the resistance ratio of the charging voltage divider in this case corresponds approximately to a ratio of the positive charging measurement resistance to the negative charging measurement resistance.

According to one preferred embodiment of the invention, a resistance ratio of the charging voltage divider also differs from a resistance ratio of the coupling voltage divider.

A positive charging measured voltage dropped across the positive sub-charging measurement resistor may be measured by a high-voltage measurement channel. Likewise, a negative charging measured voltage dropped across the negative sub-charging measurement resistor may be measured by a high-voltage measurement channel.

The battery system preferably furthermore comprises an insulation voltage divider. The insulation voltage divider in this case comprises a positive insulation measurement resistor and a positive sub-insulation measurement resistor that are connected in series with one another between the positive pole and a second reference point and are able to be disconnected from the positive pole or the second reference point by way of a positive insulation measurement switch. The insulation voltage divider also comprises a negative insulation measurement resistor and a negative sub-insulation measurement resistor that are connected in series with one another between the negative pole and the second reference point and are able to be disconnected from the negative pole or the second reference point by way of a negative insulation measurement switch. The second reference point in this case constitutes a ground potential for a voltage measurement. The insulation measurement switches are designed for example in the form of MOSFETs.

The positive insulation measurement resistance is in this case proportionately greater than the positive sub-insulation measurement resistance. The negative insulation measurement resistance is in this case proportionately greater than the negative sub-insulation measurement resistance. The ratio between the positive insulation measurement resistance and the positive sub-insulation measurement resistance may for example be 100. The ratio between the negative insulation measurement resistance and the negative sub-insulation measurement resistance may for example likewise be 100.

A positive insulation measured voltage dropped across the positive sub-insulation measurement resistor may be measured by a low-voltage measurement channel. Likewise, a negative insulation measured voltage dropped across the negative sub-insulation measurement resistor may be measured by a low-voltage measurement channel.

The battery system proposed according to the invention preferably furthermore comprises a control device that has a microcontroller having a low-voltage A/D converter (analog-to-digital converter) for converting analog measured data from the low-voltage measurement channels into digital data and a high-voltage A/D converter for converting analog measured data from the high-voltage measurement channels into digital data. The high-voltage A/D converter is in this case connected to the microcontroller via a galvanically isolated communication bus. The communication bus may in this case be designed as an SPI (Serial Peripheral Interface) bus. All of the voltage dividers may be installed in the control device of the battery system.

The battery system proposed according to the invention advantageously comprises a plurality of battery packs. In this case, two battery packs are each connected in series with one another by way of a pack switch.

Provision is advantageously made, for the positive main switch and/or the positive charging switch, for a respective precharging circuit that is connected in parallel with the respective switch and has a precharging resistor and a precharging switch connected in series with the precharging resistor.

What is also proposed is a method for diagnosing a battery system proposed according to the invention. The method proposed according to the invention comprises the following method steps:

a) Measuring the following voltages:
    a positive pack measured voltage dropped across the positive sub-pack measurement resistor,
    a negative pack measured voltage dropped across the negative sub-pack measurement resistor,
    a positive coupling measured voltage dropped across the positive sub-coupling measurement resistor,
    a negative coupling measured voltage dropped across the negative sub-coupling resistor,
    a first positive auxiliary measured voltage dropped across the positive sub-main fuse measurement resistor and, if present, a first negative auxiliary measured voltage dropped across the negative sub-main fuse measurement resistor,
    if present, a second positive auxiliary measured voltage dropped across the positive sub-charging fuse measurement resistor and/or a second negative auxiliary measured voltage dropped across the negative sub-charging fuse measurement resistor, and
if present, a positive charging measured voltage dropped across the positive sub-charging measurement resistor and a negative charging measured voltage dropped across the negative sub-charging measurement resistor;
b) Calculating the following voltages from the voltages measured in method step a):
a positive main switch voltage dropped across the positive main switch,
a negative main switch voltage dropped across the negative main switch,
a pack voltage,
a coupling voltage,
a positive main fuse voltage dropped across the positive main fuse,
if present, a negative main fuse voltage dropped across the negative main fuse,
if present, a positive charging fuse voltage dropped across the positive charging fuse and/or a negative charging fuse voltage dropped across the negative charging fuse,
if present, a positive charging switch voltage dropped across the positive charging switch, a negative charging switch voltage dropped across the negative charging switch, and a charging voltage, and
if present, a pack switch voltage dropped across the respective pack switch;
c) Evaluating the calculated voltages.

Both measurement channels assigned to a voltage divider respectively measure the voltages reduced by the voltage divider against the floating reference potential of the reference point. In this case, in each case one measurement channel measures a positive potential, and the other measurement channel measures a negative potential. This measurement method is used for each voltage to be measured at the voltage dividers.

A connection check is preferably performed on the high-voltage measurement channels before closure of the positive and the negative main switch and, if present, the positive and the negative insulation measurement switch. In this case, a plurality of measurements, preferably four measurements, are performed in succession. A set of the voltages mentioned in method step a) is measured in each of the measurements. In this case, at least the following method steps are run through while the main switches are open and, if present, while the insulation measurement switches are open:
First measurement of the voltages mentioned in method step a) before closure of the positive and the negative pack measurement switch;
Closure of the positive pack measurement switch and second measurement of the voltages mentioned in method step a);
Opening of the positive pack measurement switch, closure of the negative pack measurement switch and third measurement of the voltages mentioned in method step a);
Closure of the positive pack measurement switch and fourth measurement of the voltages mentioned in method step a);
Evaluation of the voltages measured in the respective measurements.

The pack switches and the charging switches should remain open in these measurement steps. Closing and opening the pack measurement switches shifts the reference potential of the first reference point of the measurement, and different values are measured with the potential of the poles remaining the same.

In this case, evaluating the voltages measured in the respective measurements makes it possible to check whether the high-voltage measurement channels are connected to the appropriate measurement points. A plurality of measured values may be acquired through sampling for each voltage in each measurement. The measured values of the respective voltages are provisionally stored for each measurement. In this case, each voltage in each of the measurements may be sampled only once, that is to say only one measured value of the corresponding voltage is acquired. Each voltage in each of the measurements is preferably sampled multiple times, preferably 3 to 5 times, and an average of the acquired values is formed. This average of the corresponding voltage is stored and also referred to hereinafter as measured value of the voltage.

To confirm whether a high-voltage measurement channel is connected to the measurement point assigned thereto, the voltage measured by this high-voltage measurement channel should, in at least one of the measurements, have a measured value that is other than zero. A fault whereby a high-voltage measurement channel is not connected to the measurement point assigned thereto is identified when the voltage measured by this high-voltage measurement channel, in all measurements in which the measured values are considered to be valid, in each case has a measured value that remains at zero or the absolute value of which is less than a first connection threshold value. The first connection threshold value may be specified both in the form of a fixed value and in the form of a relative value with respect to pack voltage or overall pack voltage, for example a value of 5% of the pack voltage. By way of example, the first connection threshold value is 10 V. A measurement becomes invalid if for example the positive and/or the negative pack measurement switches are open.

In order to increase the robustness of the evaluation of the measured voltages or of the calculated voltages, stored measured values of a voltage in different measurements are preferably compared with one another. This involves comparing measured values from measurements in which measured values of this voltage are considered to be valid. A fault whereby a high-voltage measurement channel is not connected to the measurement point assigned thereto is identified if the absolute values of all of the differences between the measured values of the voltage, from different measurements, measured by this high-voltage measurement channel are less than a second connection threshold value. The second connection threshold value may for example be a value of 5% of the pack voltage. By way of example, the second connection threshold value is 10 V. If the absolute value of at least one difference between the measured values of the voltage, from different measurements, measured by this high-voltage measurement channel is greater than the second connection threshold value, the high-voltage measurement channel is identified as being connected to the measurement point assigned thereto.

An offset drift check may advantageously be performed for the high-voltage A/D converter when the positive and/or negative pack measurement switches are open. In this case, the offset drift of the high-voltage A/D converter may be identified by measuring the positive pack measured voltage dropped across the positive sub-pack measurement resistor and/or the negative pack measured voltage dropped across the negative sub-pack measurement resistor. The offset drift check is preferably performed at least once per driving cycle.

Advantageously, the voltages dropped across the respective main switches and, if present, the respective charging switches are calculated after the plurality of, preferably four, measurements in order to check whether said switches are open. In this case, absolute values of the respective calculated voltages are each compared with an open threshold value. If the absolute value of a calculated voltage is greater than the open threshold value, the corresponding switch is open. The open threshold value may be specified as a fraction of the pack voltage or of the overall pack voltage. This open threshold value is for example in a range from 0 to 1000 V. By way of example, this open threshold value is 10 V.

The second, the third and the fourth measurement are preferably each performed after a waiting time for settling behavior of the potentials following closure of the positive or negative pack measurement switch. The waiting time is in this case dependent on the measurement circuit, in particular on the capacitances of the measurement circuit. By way of example, the waiting time is in a range from 0 to 100 ms. By way of example, the waiting time is 15 ms.

Individual cell voltages of the battery cells are preferably measured. In this case, the at least one battery pack of the battery system proposed according to the invention may be assigned a battery cell monitoring unit (cell supervising circuit, CSC) that comprises a plurality of voltage sensors for measuring individual cell voltages. The sum of the individual cell voltages is in this case compared with the calculated pack voltage and a fault with the corresponding high-voltage measurement channel is identified and stored if the absolute value of the difference between the sum of the individual cell voltages and the calculated pack voltage is greater than a pack voltage threshold value. The sum of the individual cell voltages is preferably compared with the calculated pack voltage after the fourth measurement, that is to say following closure of both pack measurement switches.

Differences between the sum of the individual cell voltages and the calculated pack voltage, the absolute values of which are less than the pack voltage threshold value, are preferably used to train the control device. This achieves greater accuracy for the high-voltage measurement.

The ratio between the positive and the negative pack measurement voltage may advantageously be checked for plausibility by the resistance ratio of the pack voltage divider.

A rationality check is preferably performed following closure of the main switches. When the main switches are closed, different measurement channels measure approximately the same voltage. By way of example, the positive pole of the battery pack is conductively connected to the positive terminal of the at least coupling network via the positive main switch. If it is identified that the positive main switch is closed, the measured values may be compared in order to identify impermissible drift in the measurement circuit. In this case, the load current flowing through the main switch and, if present, the charging switch is restricted, this rationality check not being performed if the absolute value of the load current is greater than a load current threshold value. By way of example, the load current threshold value is 100 A.

An insulation check is advantageously performed. In this case, at least the following method steps are run through:

Closure of the positive and the negative insulation measurement switch;

Measurement of a positive insulation measured voltage dropped across the positive sub-insulation measurement resistor and a negative insulation measured voltage dropped across the negative sub-insulation measurement resistor;

Calculation of an insulation voltage from the measured positive and the measured negative insulation measured voltage and comparison of an insulation voltage with the pack voltage;

Opening of the negative insulation measurement switch and measurement of the positive insulation measured voltage dropped across the positive sub-insulation measurement resistor;

Opening of the positive insulation measurement switch, closure of the negative insulation measurement switch and measurement of the negative insulation measured voltage dropped across the negative sub-insulation measurement resistor;

Calculation of an insulation resistance of the at least one battery pack.

A contactor-open diagnosis is preferably performed. In this case, at least the following method steps are run through following closure of the respective main switches and, if present, the respective charging switches and the respective pack switches:

Comparison of the voltage dropped across the respective switches with a contactor-open threshold value in a first debouncing time;

Confirmation of the closure of a switch if, after the first debouncing time, the absolute value of the voltage dropped across this switch is less than the contactor-open threshold value;

Notification of a fault if, after a first extended debouncing time, the absolute value of the voltage dropped across a switch is greater than the contactor-open threshold value.

After a mechanical closure time of a switch, specifically of a main switch or of a charging switch, the no-load voltage dropped across this switch should be equal to zero, and this voltage should also not change to any great extent with load.

A contactor-open diagnosis may therefore be started as early as the closure of the switch, under the proviso that no fault is identified with the switch.

The first debouncing time is in a range from 0 to 2000 ms. The first debouncing time is preferably 15 ms. At least three measurements of the voltages mentioned in method step a) are for example performed in the first debouncing time or during a first debouncing. If the absolute value of the voltage dropped across a switch is less than the contactor-open threshold value, the switch is identified as being closed. In this case, the contactor-open threshold value is in a range from 0 to 1000 V. The contactor-open threshold value is preferably 10 V.

The first extended debouncing time is in a range from 0 to 5000 ms. The first extended debouncing time is preferably 500 ms.

For switches having a precharging circuit, it is possible to perform a reliable contactor-open diagnosis only after the precharging switch has been opened. An additional contactor-open diagnosis is thus performed here.

Unintended opening of the respective switches is preferably also monitored. In this case, the voltage dropped across a switch identified as being closed is monitored continuously. A fault is identified if the absolute value of the voltage dropped across this switch exceeds an additional contactor-open threshold value in a first monitoring time, but falls below the additional contactor-open threshold value in a second monitoring time. If the absolute value of the voltage dropped across this switch is still greater than the additional contactor-open threshold value at the end of the second monitoring time, an irreversible fault is identified and stored. An irreversible fault is understood to mean that the fault is not intended to be rectified in the current driving cycle. The first monitoring time is in a range from 0 to 5000 ms. The first monitoring time is preferably 15 ms. The second monitoring time is in a range from 0 to 5000 ms. The second monitoring time is preferably 150 ms. The additional contactor-open threshold value is in a range from 0 to 1000 V. The additional contactor-open threshold value is preferably 15 V.

A contactor-stuck diagnosis is preferably performed. In this case, at least the following method steps are run through following opening of the respective main switches and, if present, the respective charging switches:

Comparison of the voltage dropped across the respective switches with a contactor-stuck threshold value in a second debouncing time;

Confirmation of the opening of a switch if, after the second debouncing time, the absolute value of the voltage dropped across this switch is greater than the contactor-stuck threshold value;

Notification of a fault if, after a second extended debouncing time, the voltage dropped across a switch is less than the contactor-stuck threshold value.

A contactor-stuck diagnosis is intended to be started when the switch is opened.

The second debouncing time is in a range from 0 to 2000 ms. The second debouncing time is preferably 15 ms. At least three measurements of the voltages mentioned in method step a) are for example performed in the second debouncing time or during a second debouncing. If the absolute value of the voltage dropped across a switch is greater than the contactor-stuck threshold value, the switch is identified as open. In this case, the contactor-stuck threshold value is in a range from 0 to 1000 V. The contactor-stuck threshold value is preferably 10 V.

The second extended debouncing time is in a range from 0 to 5000 ms. The second extended debouncing time is preferably 500 ms.

For battery systems having groups of switches, such as for example a main group of switches that comprises a positive and a negative main switch, and/or a group of charging switches that comprises a positive and a negative charging switch, at least one contactor-stuck diagnosis is performed for all of the switches in the corresponding group of switches after all of the switches in this group of switches have been opened.

For battery systems in which a switch is used for a plurality of groups of switches, a contactor-stuck diagnosis for these switches could be pending until all of the groups of switches are open.

What is also proposed is a motor vehicle that comprises a battery system proposed according to the invention and/or that is configured to perform a method proposed according to the invention.

Advantages of the Invention

If the battery system according to the invention is installed in an electric vehicle, then it is galvanically isolated from a further low-voltage network in the electric vehicle. It is thus possible to perform voltage measurements on the battery system with galvanic isolation from the low-voltage network. The reference point to which the voltage dividers are connected in this case constitutes a floating reference potential for a voltage measurement. A voltage comparison between the networks and the battery pack and a distortion of a reference potential of the reference point makes it possible to check the plausibility of the switching state monitoring. It is likewise possible to diagnose the switches independently of any voltage present on the respective network to be connected. Diagnostic coverage is increased considerably, in particular for double insulation faults. A particularly robust contactor-open diagnosis and a particularly robust contactor-stuck diagnosis are possible. No additional auxiliary voltage sources or auxiliary current sources are in this case necessary for such a contactor-open diagnosis and such a contactor-stuck diagnosis. The method according to the invention makes it possible to diagnose the switching states, and it is possible to detect potentially defective components.

By virtue of the method proposed according to the invention, the full potential of the circuit is utilized in order to unambiguously diagnose the high-voltage measurement circuit independently of the switching state and fault state of the battery switch-off device and the voltage level of the connected sub-networks. It is furthermore made possible to diagnose the battery switch-off device and other components, such as for example fuses, largely independently of the voltage present on the network to be connected.

BRIEF DESCRIPTION OF THE DRAWINGS

Embodiments of the invention are explained in more detail on the basis of the drawings and the following description.

In the figures.

DETAILED DESCRIPTION

In the following description of the embodiments of the invention, identical or similar elements are denoted using identical reference signs, in which case a repeated description of these elements is dispensed with in individual cases. The figures only schematically illustrate the subject matter of the invention.

Figure 1:
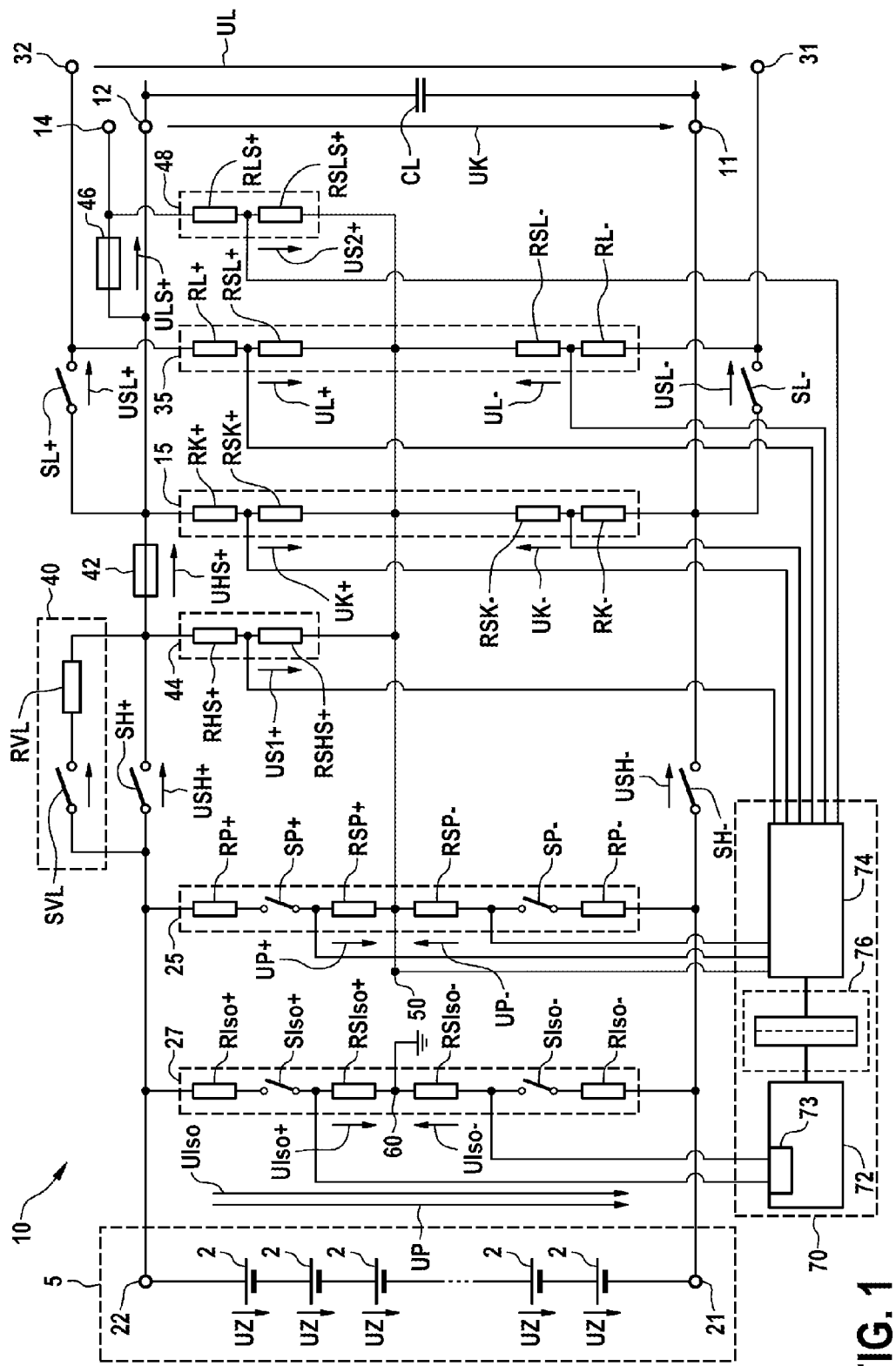
FIG. 1 shows a schematic illustration of a first embodiment of a battery system proposed according to the invention.

FIG. 1 shows a schematic illustration of a first embodiment of a battery system 10 proposed according to the invention.

In this case, the battery system 10 comprises a battery pack 5 that has a negative pole 21, a positive pole 22 and a plurality of battery cells 2 connected in series with one another, each having a cell voltage UZ, and a pack voltage divider 25.

The battery system 10 furthermore comprises a coupling network that has a first negative terminal 11 and a first positive terminal 12, and a coupling voltage divider 15. In this case, the first positive terminal 12 is able to be connected to the positive pole 22 by way of a positive main switch SH+ and the first negative terminal 11 is able to be connected to the negative pole 21 by way of a negative main switch SH−. The main switches SH+, SH− are designed for example in the form of electromechanical relays or contactors.

The pack voltage divider 25 in this case has a positive pack measurement resistor RP+ and a positive sub-pack measurement resistor RSP+ that are connected in series with one another between the positive pole 22 and a first reference point 50 and are able to be disconnected from the positive pole 22 or the first reference point 50 by way of a positive pack measurement switch SP+. The pack voltage divider 25 furthermore has a negative pack measurement resistor RP− and a negative sub-pack measurement resistor RSP− that are connected in series with one another between the negative pole 21 and the first reference point 50 and are able to be disconnected from the negative pole 21 or the first reference point 50 by way of a negative pack measurement switch SP−. The first reference point 50 in this case constitutes a floating reference potential for a voltage measurement.

The battery system 10 furthermore has an insulation voltage divider 27. The insulation voltage divider 27 in this case comprises a positive insulation measurement resistor RIso+ and a positive sub-insulation measurement resistor RSIso+ that are connected in series with one another between the positive pole 22 and a second reference point 60 and are able to be disconnected from the positive pole 22 or the second reference point 60 by way of a positive insulation measurement switch SIso+. The insulation voltage divider 27 also comprises a negative insulation measurement resistor RIso− and a negative sub-insulation measurement resistor RSIso− that are connected in series with one another between the negative pole 21 and the second reference point 60 and are able to be disconnected from the negative pole 21 or the second reference point 60 by way of a negative insulation measurement switch SIso−. The second reference point 60 in this case constitutes a ground potential for a voltage measurement.

The respective measurement switches SP+, SP−, SIso+, SIso− are designed for example in the form of MOSFETs or relays.

A positive pack measured voltage UP+ dropped across the positive sub-pack measurement resistor RSP+ is measured by a high-voltage measurement channel. Likewise, a negative pack measured voltage UP− dropped across the negative sub-pack measurement resistor RSP− is measured by a high-voltage measurement channel. A pack voltage UP is calculated from the positive and the negative pack measured voltage UP+, UP−.

A positive insulation measured voltage UIso+ dropped across the positive sub-insulation measurement resistor RSIso+ is measured by a low-voltage measurement channel. Likewise, a negative insulation measured voltage UIso− dropped across the negative sub-insulation measurement resistor RSIso− is measured by a low-voltage measurement channel. An insulation voltage UIso is calculated from the positive and the negative insulation measured voltage USio+, UIso−.

The coupling network also has an intermediate circuit capacitor CL that is connected between the first positive terminal 12 and the first negative terminal 11.

The coupling voltage divider 15 in this case has a positive coupling measurement resistor RK+ and a positive sub-coupling measurement resistor RSK+ that are connected in series with one another between the first positive terminal 12 and the first reference point 50. The coupling voltage divider 15 furthermore has a negative coupling measurement resistor RK− and a negative sub-coupling measurement resistor RSK− that are connected in series with one another between the first negative terminal 11 and the first reference point 50.

A positive coupling measured voltage UK+ dropped across the positive sub-coupling measurement resistor RSK+ is measured by a high-voltage measurement channel. Likewise, a negative coupling measured voltage UK− dropped across the negative sub-coupling measurement resistor RSK− is measured by a high-voltage measurement channel. A coupling voltage UK is calculated from the positive and the negative coupling measured voltage UK+, UK−.

The battery system 10 also comprises a positive main fuse 42 and, for the diagnosis thereof, a first positive auxiliary voltage divider 44. In this case, the positive main fuse 42 is connected between the positive main switch SH+ and the first positive terminal 12. In this case, the first positive auxiliary voltage divider 44 comprises a positive main fuse measurement resistor RHS+ and a positive sub-main fuse measurement resistor RSHS+ that are connected in series with one another between a first connection of the positive main fuse 42, which is connected to the positive main switch SH+, and the first reference point 50.

A first positive auxiliary measured voltage US1+ dropped across the positive sub-main fuse measurement resistor RSHS+ is measured by a high-voltage measurement channel.

The coupling network furthermore has a second positive terminal 14 for connecting the battery system 10 to a charger, such as for example a vehicle charger. In this case, a positive charging fuse 46 is connected to a second positive auxiliary voltage divider 48 between the second positive terminal 14 and the first positive terminal 12. The second positive auxiliary voltage divider 48 in this case comprises a positive charging fuse measurement resistor RLS+ and a positive sub-charging fuse measurement resistor RSLS+ that are connected in series with one another between the second positive terminal 14 and the first reference point 50.

A second positive auxiliary measured voltage US2+ dropped across the positive sub-charging fuse measurement resistor RSLS+ is measured by a high-voltage measurement channel.

The battery system 10 furthermore comprises a fast-charging network. The fast-charging network in this case has a negative fast-charging connection 31 and a positive fast-charging connection 32. The positive fast-charging connection 32 is in this case able to be connected to the first positive terminal 12 by way of a positive charging switch SL+ and the negative fast-charging connection 31 is able to be connected to the first negative terminal 11 by way of a negative charging switch SL−. The battery system 10 furthermore comprises a charging voltage divider 35. The charging voltage divider 35 in this case comprises a positive charging measurement resistor RL+ and a positive sub-charging measurement resistor RSL+ that are connected in series with one another between the positive fast-charging connection 32 and the first reference point 50, and a negative charging measurement resistor RL− and a negative sub-charging measurement resistor RSL− that are connected in series between the negative fast-charging connection 31 and the first reference point 50. The charging switches SL+, SL− are designed for example in the form of electromechanical relays or contactors.

A positive charging measured voltage UL+ dropped across the positive sub-charging measurement resistor RSL+ is measured by a high-voltage measurement channel. Likewise, a negative charging measured voltage dropped across the negative sub-charging measurement resistor RSL− is measured by a high-voltage measurement channel. A charging voltage UL is calculated from the positive and the negative charging measured voltage UL+, UL−.

The positive pack measurement resistor RP+ in the present case has a value of 5 MΩ. The positive sub-pack measurement resistor RSP+ in the present case has a value of 50 kΩ. The negative pack measurement resistor RP− in the present case has a value of 5 MΩ. The negative sub-pack measurement resistor RSP− in the present case has a value of 50 kΩ. A resistance ratio of the pack voltage divider 25 corresponds approximately to a ratio of the positive pack measurement resistor RP+ to the negative pack measurement resistor RP−. In the present case, the resistance ratio of the pack voltage divider 25 is thus:

$$RP+/RP-=5/5=1$$

The positive insulation measurement resistor RIso+ in the present case has a value of 1 MΩ. The positive sub-insulation measurement resistor RSIso+ in the present case has a value of 10 kΩ. The negative insulation measurement resistor RSIso− in the present case has a value of 1 MΩ. The negative sub-insulation measurement resistor RSIso− in the present case has a value of 10 kΩ. A resistance ratio of the insulation voltage divider 27 corresponds approximately to a ratio of the positive insulation measurement resistor RIso+ to the negative insulation measurement resistor RIso−. In the present case, the resistance ratio of the insulation voltage divider 27 is thus:

$$RIso+/RIso-=1/1=1$$

The positive coupling measurement resistor RK+ in the present case has a value of 3 MΩ. The positive sub-coupling measurement resistor RSK+ in the present case has a value of 30 kΩ. The negative coupling measurement resistor RK− in the present case has a value of 7 MΩ. The negative sub-coupling measurement resistor RSK− in the present case has a value of 70 kΩ. A resistance ratio of the coupling voltage divider 15 corresponds approximately to a ratio of the positive coupling measurement resistor RK+ to the negative coupling measurement resistor RK−. In the present case, the resistance ratio of the coupling voltage divider 15 is thus:

$$RK+/RK-=3/7\approx0.429$$

The positive charging measurement resistor RL+ in the present case has a value of 7 MΩ. The positive sub-charging measurement resistor RSL+ in the present case has a value of 70 kΩ. The negative charging measurement resistor RL− in the present case has a value of 3 MΩ. The negative sub-charging measurement resistor RSL− in the present case has a value of 30 kΩ. A resistance ratio of the charging voltage divider 35 corresponds approximately to a ratio of the positive charging measurement resistor RL+ to the negative charging measurement resistor RL−. In the present case, the resistance ratio of the charging voltage divider 35 is thus:

$$RL+/RL-=7/3\approx2.333$$

The battery system 10 furthermore comprises a control device 70 that has a microcontroller 72 having a low-voltage A/D converter 73 for converting analog measured data from the low-voltage measurement channels into digital data. The measurement points of the insulation voltage dividers 27 are in this case electrically connected to the low-voltage A/D converter 73 or the low-voltage measurement channels of the low-voltage A/D converter 73.

The control device 70 furthermore comprises a high-voltage A/D converter 74 for converting analog measured data from the high-voltage measurement channels into digital data. The measurement points of the pack voltage divider 25, of the coupling voltage divider 15, of the charging voltage divider 35, of the first positive auxiliary voltage divider 44 and of the second positive auxiliary voltage divider 48 are in this case electrically connected to the high-voltage A/D converter 74 or the high-voltage measurement channels of the high-voltage A/D converter 74. The first reference point 50 is also electrically connected to the high-voltage A/D converter 74. The high-voltage A/D converter 74 is in this case connected to the microcontroller 72 via a galvanically isolated communication bus 76.

The pack voltage divider 25, the insulation voltage divider 27, the coupling voltage divider 15, the charging voltage divider 35, the first positive auxiliary voltage divider 44 and the second positive auxiliary voltage divider 48 may also in this case be installed in the control device 70.

Provision is furthermore made, for the positive main switch SH+, for a precharging circuit 40 that is connected in parallel with the positive main switch SH+ and has a precharging resistor RVL and a precharging switch SVL connected in series with the precharging resistor RVL.

The following table illustrates the calculation of the pack voltage UP of the battery pack 5, of the voltages USH+, USH1−, USL+, USL− dropped across the respective switch SH+, SH−, SL+, SL−, of the voltages UHS+, ULS+ dropped across the respective positive fuses 42, 46, of the coupling voltage UK and of the charging voltage UL from the abovementioned measured voltages UP+, UP−, UK+, UK−, UL+, UL−, US1+, US2+. By way of example, the pack voltage UP is calculated by subtracting the negative pack measured voltage UP− (subtrahend) from the positive pack measured voltage UP+(minuend), that is to say the pack voltage UP is given by the formula UP=UP+−UP−.

Figure 2:
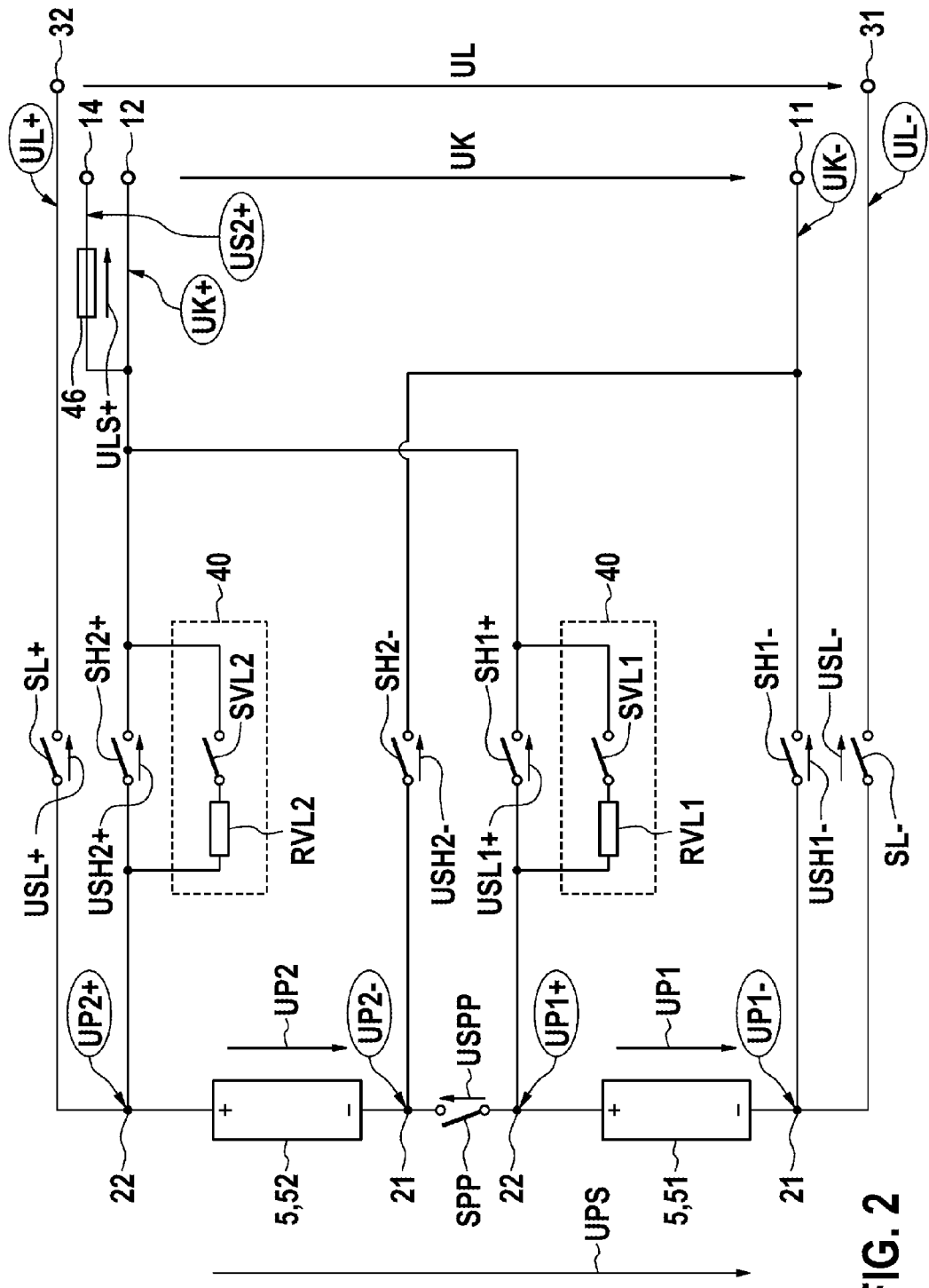
FIG. 2 shows a schematic illustration of a second embodiment of the battery system proposed according to the invention.

|  |  | Subtrahend | | | | | | | |
| --- | --- | --- | --- | --- | --- | --- | --- | --- | --- |
|  |  | UP+ | UP− | US1+ | UK+ | UK− | UL+ | UL− | US2+ |
| Minuend | UP+ | — | UP | USH+ | — | — | — | — | — |
|  | UP− | — | — | — | — | USH− | — | — | — |
|  | US1+ | — | — | — | UHS+ | — | — | — | — |
|  | UK+ | — | — | — | — | UK | USL+ | — | USL+ |
|  | UK− | — | — | — | — | — | — | USL− | — |
|  | UL+ | — | — | — | — | — | — | UL | — |
|  | UL− | — | — | — | — | — | — | — | — |
|  | US2+ | — | — | — | — | — | — | — | — | sub-charging measurement resistor RSL− in the present case has a value of 30 kΩ. A resistance ratio of the charging voltage divider 35 corresponds approximately to a ratio of FIG. 2 shows a schematic illustration of a second embodiment of the battery system 10 proposed according to the invention. In this case, the second embodiment of the battery system 10 proposed according to the invention is illustrated in highly simplified form.

The battery system 10 in this case comprises two battery packs 5, specifically a first battery pack 51 and a second battery pack 52. The two battery packs 51, 52 are each designed in a manner identical to the battery pack 5 in FIG. 1, and each comprises a negative pole 21, a positive pole 22, and a plurality of battery cells 2 connected in series with one another. The battery system 10 in this case comprises two pack voltage dividers 25 (cf. FIG. 1) that are each assigned to a battery pack 51, 52. The two battery packs 51, 52 are in this case connected in series with one another between the positive pole 22 of the first battery pack 51 and the negative pole 21 of the second battery pack 52 by way of a pack switch SPP. A first positive main switch SH1+ and a first negative main switch SH1− are provided for the first battery pack 51. A second positive main switch SH2+ and a second negative main switch SH2− are provided for the second battery pack 52. A respective precharging circuit 40 is provided for the two positive main switches SH1+, SH2. The precharging circuit 40 for the first positive main switch SH1+ is connected in parallel with the first positive main switch SH1+ and in this case comprises a first precharging resistor RVL1 and a first precharging switch SVL1 connected in series with the first precharging resistor RVL1. The precharging circuit 40 for the second positive main switch SH2+ is connected in parallel with the second positive main switch SH2+ and in this case comprises a second precharging resistor RVL2 and a second precharging switch SVL2 connected in series with the second precharging resistor RVL2.

The battery system 10 comprises a coupling network that has a first negative terminal 11 and a first positive terminal 12, and a coupling voltage divider 15 (cf. FIG. 1). The first negative terminal 11 is in this case able to be connected to the negative pole 21 of the first battery pack 51 by way of the first negative main switch SH1− and is able to be connected to the negative pole 21 of the second battery pack 52 by way of the second negative main switch SH2−. The first positive terminal 12 is in this case able to be connected to the positive pole 22 of the first battery pack 51 by way of the first positive main switch SH1+ and is able to be connected to the positive pole 22 of the second battery pack 52 by way of the second positive main switch SH2+. The coupling network furthermore comprises a second positive terminal 14 for connecting the battery system 10 to a charger, such as for example a vehicle charger. The second positive terminal 14 is in this case connected to the first positive terminal 12 via a positive charging fuse 46.

The battery system 10 furthermore comprises a fast-charging network that has a negative fast-charging connection 31 and a positive fast-charging connection 32, and a charging voltage divider 35 (cf. FIG. 1). The negative fast-charging connection 31 is able to be connected to the negative pole 21 of the first battery pack 51 by way of a negative charging switch SL−. The positive fast-charging connection 32 is able to be connected to the positive pole 22 of the second battery pack 52 by way of a positive charging switch SH+.

To simplify the illustration in FIG. 2, the two pack voltage dividers 25, the coupling voltage divider 15 and the charging voltage divider 35 are not illustrated. For the positive charging fuse 46, provision is made for a second positive auxiliary voltage divider 48 (cf. FIG. 1), this likewise not being illustrated in FIG. 2.

The method proposed according to the invention may be expanded or adapted for the second embodiment of the battery system 10 proposed according to the invention in FIG. 2.

FIG. 2 schematically shows that a first positive pack measured voltage UP1+, a first negative pack measured voltage UP1−, a second positive pack measured voltage UP2+, a second negative pack measured voltage UP2−, a positive coupling measured voltage UK+, a negative coupling measured voltage UK−, a positive charging measured voltage UL+, a negative charging measured voltage UL− and a second positive auxiliary measured voltage US2+ are measured.

The following table illustrates the calculation of the pack voltages UP1, UP2 of the respective battery packs 51, 52, of the overall pack voltage UPS, of the voltages USH1+, USH2+, USH1−, USH2−, USL+, USL−, USPP dropped across the respective switches SH1+, SH2+, SH1−, SH2−, SL+, SL−, SPP, of the voltage ULS+ dropped across the positive charging fuse 46, of the coupling voltage UK and of the charging voltage UL from the abovementioned measured voltages UP1+, UP1−, UP2+, UP2−, UK+, UK−, UL+, UL−, US2+. By way of example, the first pack voltage UP1 is calculated by subtracting the first negative pack measured voltage UP1− (subtrahend) from the first positive pack measured voltage UP1+(minuend), that is to say the first pack voltage UP1 is given by the formula UP1=UP1+−UP1−.

|         |      | Subtrahend |      |      |      |       |       |       |      |      |
|---------|------|------|------|------|------|-------|-------|-------|------|------|
|         |      | UP1+ | UP1− | UP2+ | UP2− | UK+   | UK−   | UL+   | UL−  | US2+ |
| Minuend | UP1+ | —    | UP1  | —    | USPP | USH+  | —     | —     | —    | —    |
|         | UP1− | —    | —    | —    | —    | —     | USH1− | —     | USL− | —    |
|         | UP2+ | —    | UPS  | —    | UP2  | USH2+ | —     | USL+  | —    | —    |
|         | UP2− | —    | —    | —    | —    | —     | USH2− | —     | —    | —    |
|         | UK+  | —    | —    | —    | —    | —     | UK    | —     | —    | ULS+ |
|         | UK−  | —    | —    | —    | —    | —     | —     | —     | —    | —    |
|         | UL+  | —    | —    | —    | —    | —     | —     | —     | UL   | —    |
|         | UK−  | —    | —    | —    | —    | —     | —     | —     | —    | —    |
|         | US2+ | —    | —    | —    | —    | —     | —     | —     | —    | —    |

Figure 3:
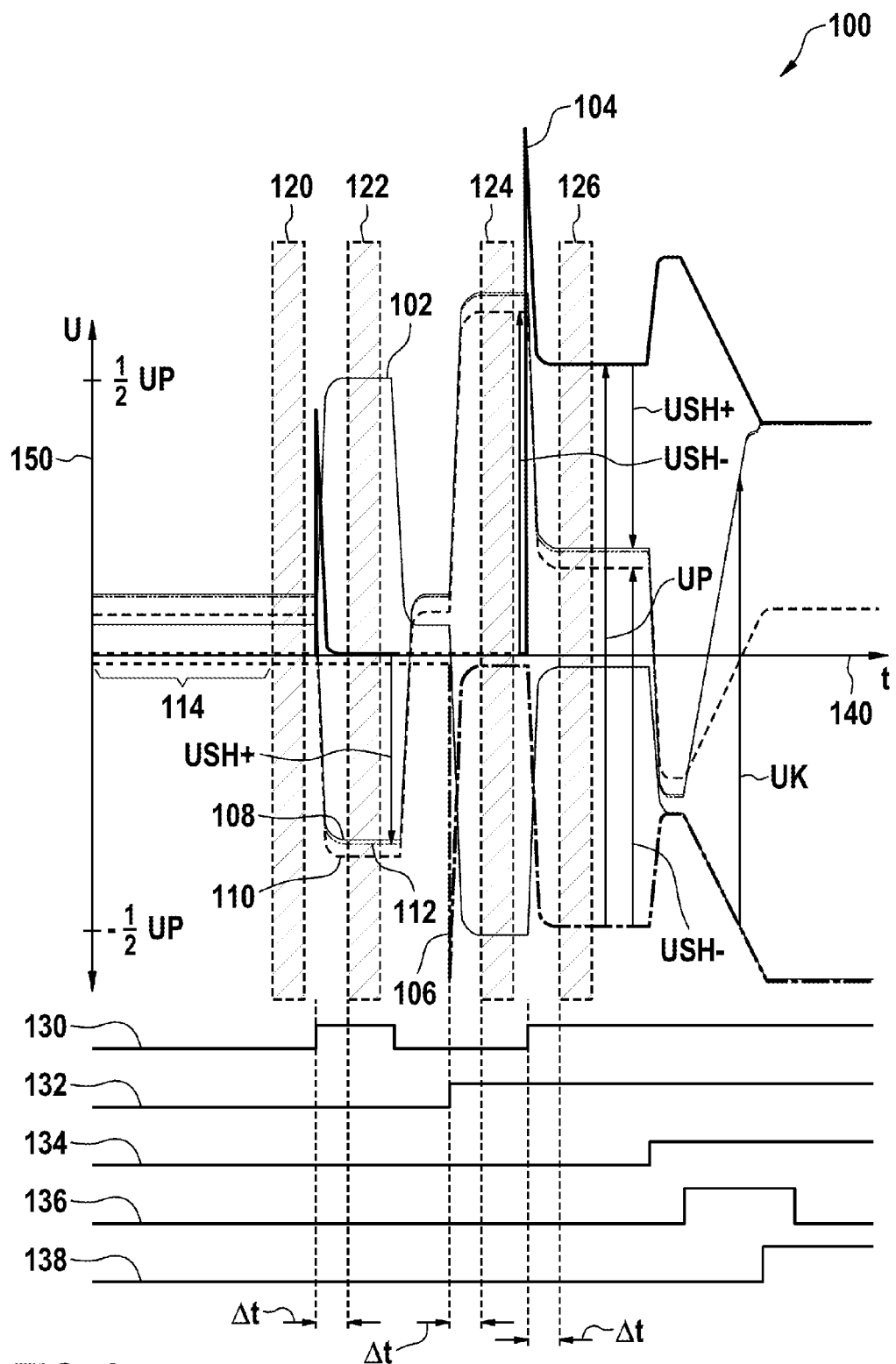
FIG. 3 shows a schematic illustration of temporal profiles of the measured voltages.

FIG. 3 shows a schematic illustration of temporal profiles of the measured voltages of the battery system 10 illustrated in FIG. 1, and temporal profiles of control signals for controlling the pack measurement switches SP+, SP−, the main switches SH+, SH− and the precharging switch SVL.

FIG. 3 illustrates a two-dimensional coordinate system 100. The two-dimensional coordinate system 100 in this case comprises a first axis 140, on which time is plotted, and a second axis 150, perpendicular to the first axis 140, on which voltage is plotted.

FIG. 3 shows a temporal profile 102 of the floating reference potential of the first reference point 50, a temporal profile 104 of the positive pack measured voltage UP+, a temporal profile 106 of the negative pack measured voltage UP−, a temporal profile 108 of the positive coupling measured voltage UK+, a temporal profile 110 of the negative coupling measured voltage UK− and a temporal profile 112 of the first positive auxiliary measured voltage US1+.

Likewise shown are a temporal profile 130 of a control signal for controlling the positive pack measurement switch SP+, a temporal profile 132 of a control signal for controlling the negative pack measurement switch SP−, a temporal profile 134 of a control signal for controlling the negative main switch SH−, a temporal profile 136 of a control signal for controlling the precharging switch SVL and a temporal profile 138 of a control signal for controlling the positive main switch SH+.

Following an initialization phase 114 of the high-voltage A/D converter 74, a connection check is performed on the high-voltage measurement channels while the main switches SH+, SH− and insulation measurement switches SIso+, SIso− are open. In this case, a first measurement 120, a second measurement 122, a third measurement 124 and a fourth measurement 126 are performed. A set of voltages, specifically a positive pack measured voltage UP+, a negative pack measured voltage UP−, a positive coupling measured voltage UK+, a negative coupling measured voltage UK−, a positive charging measured voltage UL+, a negative charging measured voltage UL−, a first positive auxiliary measured voltage US1+ and a second positive auxiliary measured voltage US2+, is measured in each of the measurements 120, 122, 124, 126. In this case, evaluating the voltages UP+, UP−, UK+, UK−, UL+, UL−, US1+, US2+ measured in the respective measurements 120, 122, 124, 126 makes it possible to check whether the high-voltage measurement channels are connected to the appropriate measurement points. Each measured voltage UP+, UP−, UK+, UK−, UL+, UL−, US1+, US2+ in each of the measurements 120, 122, 124, 126 is in this case sampled multiple times, preferably 3 to 5 times, and an average of the acquired values is formed. This average of the corresponding measured voltage UP+, UP−, UK+, UK−, UL+, UL−, US1+, US2+ is stored and referred to as measured value of the respective voltages UP+, UP−, UK+, UK−, UL+, UL−, US1+, US2+.

The first measurement 120 is first performed before closure of the positive and the negative pack measurement switch SP+, SP−. The level of the floating reference potential of the first reference point 50 is initially undefined. This may be caused for example by an even distribution of the insulation resistances of the battery cells 2. The same also applies to the coupling measured voltages UK+, UK−, the magnitude of which depends on the distribution of the insulation resistances of the battery pack 5 and the external components connected to the coupling network. The residual voltage of the intermediate circuit capacitor CL leads to a difference between the positive coupling measured voltage UK+ and the negative coupling measured voltage UK−. The coupling voltage UK may also be calculated when the measurement of the positive and negative pack measured voltage UP+, UP− has not yet finished, specifically SP+ and/or SP− are open.

Following the first measurement 120, an offset drift check may be performed for the high-voltage A/D converter 74.

The positive pack measurement switch SP+ is then closed. On account of the pack voltage divider 25, the floating reference potential of the first reference point 50 is brought to a positive pack potential, in this case UP/2. The second measurement 122 is performed after a waiting time Δt for settling behavior of the potentials following closure of the positive pack measurement switch SP+. Since the floating reference potential is brought to the positive pack potential, a low measured value of the positive pack measured voltage UP+ is acquired. On account of the open main switches SH+, SH−, the coupling voltage UK and the charging voltage UL are decoupled in the first and the second measurement 120, 122. A respective change is acquired for the coupling measured voltages UK+, UK−, the charging measured voltages UL+, UL− and the first and the second positive auxiliary measured voltage US1+, US2+. In this case, this change corresponds approximately to a negative change in the floating reference potential.

The positive pack measurement switch SP+ is then opened and the negative pack measurement switch SP− is closed. The third measurement 124 is performed after a waiting time Δt for settling behavior of the potentials following the closure of the negative pack measurement switch SP−. When the negative pack measurement switch SP− is closed, the floating reference potential is brought to the negative pack potential, here −UP/2. A respective perceptible change is acquired for the coupling measured voltages UK+, UK−, the charging measured voltages UL+, UL− and the first and the second positive auxiliary measured voltage US1+, US2+ between the second measurement 122 and the third measurement 124. In this case, this change likewise corresponds approximately to a negative change in the floating reference potential.

The positive pack measurement switch SP+ is then closed and the fourth measurement 126 is performed after a waiting time Δt for settling behavior of the potentials following closure of the positive pack measurement switch SP+.

The pack voltage UP, the main switch voltages USH+, USH− and the charging switch voltages USL+, USL− are able to be calculated by way of the measured values, acquired in the respective measurements 120, 122, 124, 126, of the respective measured voltages UP+, UP−, UK+, UK−, UL+, UL−, US1+, US2+.

For a battery system 10 according to FIG. 2, the two positive pack measurement switches SP+(cf. FIG. 1) and the two negative pack measurement switches SP− (cf. FIG. 1) may be connected together in order to achieve a large potential shift of the floating reference potential for the connection check.

If the positive main fuse 42 has burned through or is defective, it will be expected that the first positive auxiliary measured voltage US1+ will have values of zero until the precharging switch SVL or the positive main switch SH+ is closed. It is therefore necessary to delay a check for the first positive auxiliary measured voltage US1+ at open load until precharging is requested and a voltage rise is identified at the coupling network either with a positive coupling measured voltage UK+ or with a coupling voltage UK that is calculated from the positive and the negative coupling measured voltage UK+, UK−.

In this case, that is to say if all four measurements 120, 122, 124, 126 for the first positive auxiliary measured voltage US1+ indicate values of zero, the positive main switch voltage USH+ should be calculated from the positive pack measured voltage UP+ and the positive coupling measured voltage UK+, even before precharging is requested, in order to allow a main switch and/or precharging switch diagnosis even if the electrical connection for measuring the first positive auxiliary measured voltage US1+ is interrupted.

If, after activation of the precharging, a voltage rise above a threshold value is established for the first positive auxiliary measured voltage US1+, the positive main switch voltage USH+ should go back to being calculated from the positive pack measured voltage UP+ and the first positive auxiliary measured voltage US1+.

The positive and the negative main switch voltage USH+, USH− also change on account of the shift in the floating reference potential, as long as the corresponding main switch SH+, SH− is open.

If it is established that the high-voltage measurement channel for measuring the positive coupling measured voltage UK+ is not connected to the appropriate measurement point and an identical measured value other than zero is acquired both for the first positive auxiliary measured voltage US1+ and for the second positive auxiliary measured voltage US2+, meaning that none of the positive fuses 42, 46 are defective, the coupling voltage UK should be calculated from the first positive auxiliary measured voltage US1+ and the negative coupling measured voltage UL−.

Figure 4:
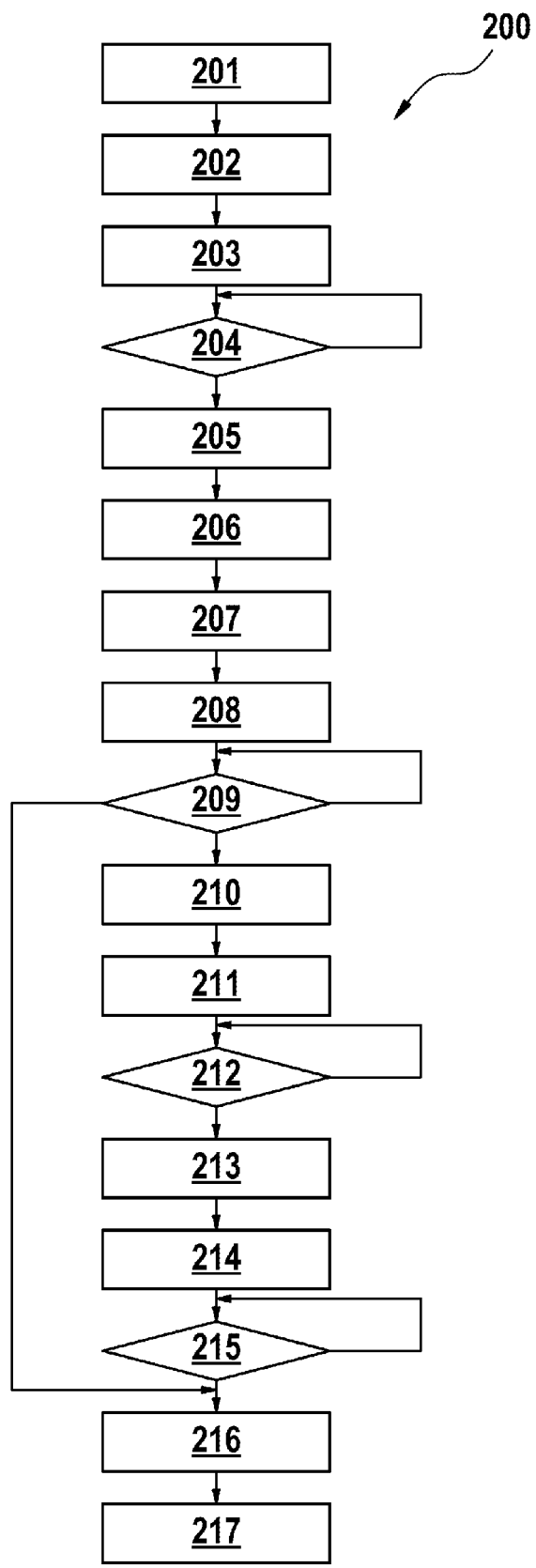
FIG. 4 shows a schematic illustration of a method sequence of a method proposed according to the invention.

FIG. 4 shows a schematic illustration of a method sequence 200 of a method proposed according to the invention for diagnosing the battery system 10 illustrated in FIG. 1.

In a method step 201, the microcontroller 72 is started up. In this case, the high-voltage A/D converter 74 is started so as to read measured values. Following the initialization phase 114 (cf. FIG. 3) of the high-voltage A/D converter 74, in a method step 202, a connection check is performed on the high-voltage measurement channels while the main switches SH+, SH− and insulation measurement switches SIso+, SIso− are open. In this case, four measurements 120, 122, 124, 126 are performed in succession. By evaluating the voltages UP+, UP−, US1+, UK+, UK−, UL+, UL−, US2+ measured in the respective measurements, it is checked whether a high-voltage measurement channel is connected to the measurement point assigned thereto. A switching state diagnosis is likewise performed for the main switches SH+, SH−. In this case, the main switch voltages USH+, USH− dropped across the respective main switches SH+, SH− are calculated and evaluated.

In a method step 203, an insulation check is performed. In this case, an insulation voltage UIso is calculated. An insulation resistance of the battery pack 5 is likewise calculated. After the insulation resistance of the battery pack 5 has been calculated, the insulation check is ended. This insulation check is also referred to as fast insulation check.

In a method step 204, it is checked whether a switch-on signal for the battery system 10 is present, by way of which switch-on signal the battery system 10 is switched on. Method step 204 is repeated until the switch-on signal for the battery system 10 is present.

If the switch-on signal for the battery system 10 is present, in a method step 205, the negative main switch SH− is first closed. A contactor-open diagnosis is then performed for the negative main switch SH−. In this case, it is checked whether the negative main switch SH− is actually closed.

After the contactor-open diagnosis has been successfully completed for the negative main switch SH− and the negative main switch SH− has been identified as being closed, in a method step 206, the precharging switch SVL is closed. A precharging switch diagnosis may be performed here in order to check the precharging qualification. This determines whether the positive main switch SH+ is able to be closed.

If the precharging qualification is confirmed positively, in a method step 207, the positive main switch SH+ is closed. The precharging switch SVL is opened at the same time or thereafter. Following closure of the positive main switch SH+, a contactor-open diagnosis is performed for the positive main switch SH+ in order to check whether the positive main switch SH+ is actually closed.

After the contactor-open diagnosis has been successfully completed for the positive main switch SH+ and the positive main switch SH+ has been identified as being closed, in a method step 208, the voltages USH+, USH− dropped across the two main switches SH+, SH− are monitored continuously in order to check whether there is unintended opening of the respective main switches SH+, SH−. In this case, the voltages USL+, USL− dropped across the positive and the negative charging switch SL+, SL− are likewise monitored. A continuous insulation check is likewise performed.

In a method step 209, it is checked whether a switch-on signal for the fast-charging network is present, by way of which switch-on signal the fast-charging network is connected to the battery pack 5, or whether a switch-off signal for the battery system 10 is present, by way of which switch-off signal the battery system 10 is switched off. Method step 209 is repeated until the switch-on signal for the fast-charging network is present or until the switch-off signal for the battery system 10 is present.

If the switch-on signal for the fast-charging network is present, in a method step 210, the continuous insulation check is first ended. The negative charging switch SL− is then closed. A contactor-open diagnosis is then performed for the negative charging switch SL−. In this case, it is checked whether the negative charging switch SL− is actually closed.

After the contactor-open diagnosis has been successfully completed for the negative charging switch SL− and the negative charging switch SL− has been identified as being closed, in a method step 211, the positive charging switch SL+ is closed. A contactor-open diagnosis is then performed for the positive charging switch SL+ in order to check whether the positive charging switch SL+ is actually closed. After the contactor-open diagnosis has been successfully completed for the positive charging switch SL+ and the positive charging switch SL+ has been identified as being closed, the voltages USH+, USH−, USL+, USL− dropped across the respective main switches SH+, SH− and across the respective charging switches SL+, SL− are monitored continuously in order to check whether there is unintended opening of the respective switches SH+, SH−, SL+, SL−. If a precharging circuit 40 is provided for the positive charging switch SL+, before closure of the positive charging switch SH+, the precharging switch SVL is closed and a precharging switch diagnosis is performed.

In a method step 212, it is checked whether a switch-off signal for the fast-charging network is present, by way of which switch-off signal the fast-charging network is disconnected from the battery pack 5. Method step 212 is repeated until the switch-off signal for the fast-charging network is present.

If the switch-off signal for the fast-charging network is present, in a method step 213, the positive charging switch SL+ is first opened. A contactor-stuck diagnosis is then performed for the positive charging switch SL+ in order to check whether the positive charging switch SL+ is actually open.

In a method step 214, the negative charging switch SL− is then first opened. A contactor-stuck diagnosis is then performed for both charging switches SL+, SL− in order to ensure that both charging switches SL+, SL− are open. The continuous insulation check is then restarted.

In a method step 215, it is checked whether a switch-off signal for the battery system 10 is present. Method step 215 is repeated until the switch-off signal for the battery system 10 is present.

If a switch-off signal for the battery system 10 is present, in a method step 216, the continuous insulation check is first ended. The positive main switch SH+ is then opened. A contactor-stuck diagnosis is then performed for the positive main switch SH+ in order to check whether the positive charging switch SH+ is actually open.

In a method step 217, the negative main switch SH− is then first opened. A contactor-stuck diagnosis is then performed for both main switches SH+, SH− in order to ensure that both main switches SH+, SH− are open.

If, in method step 209, the switch-off signal for the battery system 10 is present, method steps 216, 217 are performed in succession.

The invention is not limited to the exemplary embodiments described herein and the aspects highlighted therein. Rather, a multiplicity of modifications that are within the scope of the activities of a person skilled in the art are possible within the range set forth by the claims.

The invention claimed is:

1. A battery system (10) comprising
at least one battery pack (5, 51, 52) that has a negative pole (21), a positive pole (22), at least one battery cell (2),
at least one coupling network that
has a first negative terminal (11) and
a first positive terminal (12),
a pack voltage divider (25) and
a coupling voltage divider (15), wherein
the first positive terminal (12) is configured to be connected to the positive pole (22) by way of a positive main switch (SH+, SH1+, SH2+) and/or the first negative terminal (11) is configured to be connected to the negative pole (21) by way of a negative main switch (SH−, SH1−, SH2−), wherein
the pack voltage divider (25)
comprises a positive pack measurement resistor (RP+) and a positive sub-pack measurement resistor (RSP+) that are connected in series with one another between the positive pole (22) and a first reference point (50) and are configured to be disconnected from the positive pole (22) or the first reference point (50) by way of a positive pack measurement switch (SP+), and
a negative pack measurement resistor (RP−) and a negative sub-pack measurement resistor (RSP−) that are connected in series with one another between the negative pole (21) and the first reference point (50) and are configured to be disconnected from the negative pole (21) or the first reference point (50) by way of a negative pack measurement switch (SP−),
and wherein
the coupling voltage divider (15) comprises a positive coupling measurement resistor (RK+) and a positive sub-coupling measurement resistor (RSK+) that are connected in series with one another between the first positive terminal (12) and the first reference point (50), and
a negative coupling measurement resistor (RK−) and a negative sub-coupling measurement resistor (RSK−) that are connected in series with one another between the first negative terminal (11) and the first reference point (50), wherein
the battery system (10) comprises a positive main fuse (42) and a first positive auxiliary voltage divider (44), wherein the positive main fuse (42) is connected between the positive main switch (SH+, SH1+, SH2+) and the first positive terminal (12), wherein
the first positive auxiliary voltage divider (44) comprises a positive main fuse measurement resistor (RHS+) and a positive sub-main fuse measurement resistor (RSHS+) that are connected in series with one another between a first connection of the positive main fuse (42), which is connected to the positive main switch (SH+, SH1+, SH2+), and the first reference point (50), and/or
the battery system (10) comprises a negative main fuse (43) and a first negative auxiliary voltage divider (45), wherein the negative main fuse (43) is connected between the negative main switch (SH−, SH1−, SH2−) and the first negative terminal (11), wherein
the first negative auxiliary voltage divider (45) comprises a negative main fuse measurement resistor (RHS−) and a negative sub-main fuse measurement resistor (RSHS−) that are connected in series with one another between a first connection of the negative main fuse (43), which is connected to the negative main switch (SH−, SH1−, SH2−), and the first reference point (50).

2. The battery system (10) according to claim 1, wherein
at least one coupling network has a second positive terminal (14), wherein
a positive charging fuse (46) and a second positive auxiliary voltage divider (48) are connected between the second positive terminal (14) and the first positive terminal (12), and wherein the second positive auxiliary voltage divider (48) comprises a positive charging fuse measurement resistor (RLS+) and a positive sub-charging fuse measurement resistor (RSLS+) that are connected in series with one another between the second positive terminal (14) and the first reference point (50),
and/or
the at least one coupling network furthermore has a second negative terminal (13), wherein a negative charging fuse (47) and a second negative auxiliary voltage divider (49) are connected between the second negative terminal (13) and the first negative terminal (11), and wherein the second negative auxiliary voltage divider (49) comprises a negative charging fuse measurement resistor (RLS−) and a negative sub-charging fuse measurement resistor (RSLS−) that are connected in series with one another between the second negative terminal (13) and the first reference point (50).

3. The battery system (10) according to claim 1, further comprising
a fast-charging network that
has a negative fast-charging connection (31) and a positive fast-charging connection (32), and a charging voltage divider (35), wherein
the positive fast-charging connection (32) is configured to be connected to the first positive terminal (12) by way of a positive charging switch (SL+) and/or the negative fast-charging connection (31) is configured to be connected to the first negative terminal (11) by way of a negative charging switch (SL−), and wherein
the charging voltage divider (35)
comprises a positive charging measurement resistor (RL+) and a positive sub-charging measurement resistor (RSL+) that are connected in series with one another between the positive fast-charging connection (32) and the first reference point (50), and a negative charging measurement resistor (RL−) and a negative sub-charging measurement resistor (RSL−) that are connected in series between the negative fast-charging connection (31) and the first reference point (50).

4. The battery system (10) according to claim 1, further comprising an insulation voltage divider (27) that comprises a positive insulation measurement resistor (RIso+) and a positive sub-insulation measurement resistor (RSIso+) that are connected in series with one another between the positive pole (22) and a second reference point (60) and are configured to be disconnected from the positive pole (22) or the second reference point (60) by way of a positive insulation measurement switch (SIso+), and a negative insulation measurement resistor (RIso−) and a negative sub-insulation measurement resistor (RSIso−) that are connected in series with one another between the negative pole (21) and the second reference point (60) and are configured to be disconnected from the negative pole (21) or the second reference point (60) by way of a negative insulation measurement switch (SIso−).

5. The battery system (10) according to claim 1, furthermore comprising a control device (70) that has a microcontroller (72) having a low-voltage A/D converter (73) for converting analog measured data from low-voltage measurement channels into digital data and a high-voltage A/D converter (74) for converting analog measured data from high-voltage measurement channels into digital data, wherein the high-voltage A/D converter (74) is connected to the microcontroller (72) via a galvanically isolated communication bus (76).

6. A method for diagnosing a battery system (10) including at least one battery pack (5, 51, 52), at least one coupling network, a pack voltage divider (25) and a coupling voltage divider (15), wherein the least one battery pack (5, 51, 52) includes a negative pole (21), a positive pole (22), and at least one battery cell (2), wherein the at least one coupling network includes a first negative terminal (11) and a first positive terminal (12), the method comprising the following method steps:

a) measuring the following voltages:

a positive pack measured voltage (UP+, UP1+, UP2+) dropped across the positive sub-pack measurement resistor (RSP+), a negative pack measured voltage (UP−, UP1−, UP2−) dropped across the negative sub-pack measurement resistor (RSP−), a positive coupling measured voltage (UK+) dropped across the positive sub-coupling measurement resistor (RSK+), a negative coupling measured voltage (UK−) dropped across the negative sub-coupling resistor (RSK−), a first positive auxiliary measured voltage (US1+) dropped across the positive sub-main fuse measurement resistor (RSHS+) and, if present, a first negative auxiliary measured voltage (US1−) dropped across the negative sub-main fuse measurement resistor (RSHS−), if present, a second positive auxiliary measured voltage (US2+) dropped across the positive sub-charging fuse measurement resistor (RSLS+) and/or a second negative auxiliary measured voltage (US2−) dropped across the negative sub-charging fuse measurement resistor (RSLS−), and if present, a positive charging measured voltage (UL+) dropped across the positive sub-charging measurement resistor (RSL+) and a negative charging measured voltage (UL−) dropped across the negative sub-charging measurement resistor (RSL−);

b) Calculating the following voltages from the voltages (UP+, UP1+, UP2+, UP−, UP1−, UP2−, UK+, UK−, US1+, US1−, US2+, US2−, UL+, UL−) measured in method step a):

a positive main switch voltage (USH+, USH1+, USH2+) dropped across the positive main switch (SH+, SH1+, SH2+), a negative main switch voltage (USH−, USH1−, USH2−) dropped across the negative main switch (SH−, SH1−, SH2−), a pack voltage (UP, UP1, UP2), a coupling voltage (UK), a positive main fuse voltage (UHS+) dropped across the positive main fuse (42), if present, a negative main fuse voltage (UHS−) dropped across the negative main fuse (43), if present, a positive charging fuse voltage (ULS+) dropped across the positive charging fuse (46) and/or a negative charging fuse voltage (ULS−) dropped across the negative charging fuse (47), if present, a positive charging switch voltage (USL+) dropped across the positive charging switch (SL+), a negative charging switch voltage (USL−) dropped across the negative charging switch (SL−), and a charging voltage (UL), and if present, a pack switch voltage (USPP) dropped across the pack switch (SPP);

c) evaluating the calculated voltages (USH+, USH1+, USH2+, USH−, USH1−, USH2−, UP, UP1, UP2, UK, UHS+, UHS−, ULS+, ULS−, USL+, USL−, UL, USPP).

7. The method according to claim 6, wherein at least the following method steps are run through while the main switches (SH+, SH1+, SH2+, SH−, SH1−, SH2−) are open and, if present, while the insulation measurement switches (SIso+, SIso−) and the pack switch (SPP) are open:

first measurement (120) of the voltages (UP+, UP−, UK+, UK−, US1+, US1−, US2+, US2−, UL+, UL−) mentioned in method step a) before closure of the positive and the negative pack measurement switch (SP+, SP−);

closure of the positive pack measurement switch (SP+) and second measurement (122) of the voltages (UP+, UP−, UK+, UK−, US1+, US1−, US2+, US2−, UL+, UL−) mentioned in method step a);

opening of the positive pack measurement switch (SP+), closure of the negative pack measurement switch (SP−) and third measurement (124) of the voltages (UP+, UP−, UK+, UK−, US1+, US1−, US2+, US2−, UL+, UL−) mentioned in method step a);

closure of the positive pack measurement switch (SP+) and fourth measurement (126) of the voltages (UP+, UP−, UK+, UK−, US1+, US1−, US2+, US2−, UL+, UL−) mentioned in method step a);

evaluation of the voltages (UP+, UP−, UK+, UK−, US1+, US1−, US2+, US2−, UL+, UL−) measured in the respective measurements (120, 122, 124, 126).

8. The method according to claim 7, wherein the second, the third and the fourth measurement (122, 124, 126) are each performed after a waiting time (Δt) following closure of the positive or negative pack measurement switch (SP+, SP−).

9. The method according to claim 6, wherein individual cell voltages (UZ) of the battery cells (2) are measured, wherein the sum of the individual cell voltages (UZ) is compared with the calculated pack voltage (UP, UP1, UP2), wherein a fault with the corresponding high-voltage measurement channel is stored if the absolute value of the difference between the sum of the individual cell voltages (UZ) and the calculated pack voltage (UP, UP1, UP2) is greater than a pack voltage threshold value.

10. The method according to claim 9, wherein differences between the sum of the individual cell voltages (UZ) and the calculated pack voltage (UP, UP1, UP2), the absolute values of which are less than the pack voltage threshold value, are used to train the control device (70).

11. The method according to claim 6, wherein at least the following method steps are run through following closure of the respective main switch (SH+, SH1+, SH2+, SH−, SH1−, SH2−) and, if present, the respective charging switch (SL+, SL−):
comparison of the voltage (USH+, USH1+, USH2+, USH−, USH1−, USH2−, USL+, USL−) dropped across the respective switches (SH+, SH1+, SH2+SH−, SH1−, SH2−, SL+, SL−) with a contactor-open threshold value in a first debouncing time (AU);
confirmation of the closure of a switch (SH+, SH1+, SH2+SH−, SH1−, SH2−, SL+, SL−) if, after the first debouncing time (Δt11), the absolute value of the voltage (USH+, USH1+, USH2+, USH− USH1−, USH2−, USL+, USL−) dropped across this switch is less than the contactor-open threshold value;
notify of a fault if, after a first extended debouncing time (Δt11), the absolute value of the voltage (USH+, USH1+, USH2+, USH−, USH1−, USH2−, USL+, USL−) dropped across a switch (SH+, SH1+, SH2+, SH−, SH1−, SH2− SL+, SL−) is greater than the contactor-open threshold value.

12. The method according to claim 6, wherein at least the following method steps are run through following opening of the respective main switch (SH+, SH1+, SH2+, SH−, SH1−, SH2−) and, if present, the respective charging switch (SL+, SL−):
comparison of the voltage (USH+, USH1+, USH2+, USH−, USH1−, USH2−, USL+, USL−) dropped across the respective switches (SH+, SH1+, SH2+SH−, SH1−, SH2−, SL+, SL−) with a contactor-stuck threshold value in a second debouncing time (Δt2);
confirmation of the opening of a switch (SH+, SH1+, SH2+, SH−, SH1−, SH2−, SL+, SL−) if, after the second debouncing time (Δt2), the absolute value of the voltage (USH+, USH1+, USH2+, USH−, USH1−, USH2−, USL+, USL−) dropped across this switch (SH+, SH1+, SH2+, SH−, SH1−, SH2−, SL+, SL−) is greater than the contactor-stuck threshold value;
notification of a fault if, after a second extended debouncing time (Δt21), the absolute value of the voltage (USH+, USH1+, USH2+, USH−, USH1−, USH2−, USL+, USL−) dropped across a switch (SH+, SH1+, SH2+, SH−, SH1−, SH2−, SL+, SL−) is less than the contactor-stuck threshold value.

13. A motor vehicle that comprises a battery system (10), the battery system including:
at least one battery pack (5, 51, 52) that has a negative pole (21), a positive pole (22), at least one battery cell (2),
at least one coupling network that has a first negative terminal (11) and a first positive terminal (12),
a pack voltage divider (25), and
a coupling voltage divider (15), wherein
the first positive terminal (12) is configured to be connected to the positive pole (22) by way of a positive main switch (SH+, SH1+, SH2+) and/or the first negative terminal (11) is configured to be connected to the negative pole (21) by way of a negative main switch (SH−, SH1−, SH2−), wherein
the pack voltage divider (25) comprises a positive pack measurement resistor (RP+) and a positive sub-pack measurement resistor (RSP+) that are connected in series with one another between the positive pole (22) and a first reference point (50) and are configured to be disconnected from the positive pole (22) or the first reference point (50) by way of a positive pack measurement switch (SP+), and
a negative pack measurement resistor (RP−) and a negative sub-pack measurement resistor (RSP−) that are connected in series with one another between the negative pole (21) and the first reference point (50) and are configured to be disconnected from the negative pole (21) or the first reference point (50) by way of a negative pack measurement switch (SP−),
and wherein the coupling voltage divider (15) comprises a positive coupling measurement resistor (RK+) and a positive sub-coupling measurement resistor (RSK+) that are connected in series with one another between the first positive terminal (12) and the first reference point (50), and
a negative coupling measurement resistor (RK−) and a negative sub-coupling measurement resistor (RSK−) that are connected in series with one another between the first negative terminal (11) and the first reference point (50), wherein
the battery system (10) comprises a positive main fuse (42) and a first positive auxiliary voltage divider (44), wherein the positive main fuse (42) is connected between the positive main switch (SH+, SH1+, SH2+) and the first positive terminal (12), wherein
the first positive auxiliary voltage divider (44) comprises a positive main fuse measurement resistor (RHS+) and a positive sub-main fuse measurement resistor (RSHS+) that are connected in series with one another between a first connection of the positive main fuse (42), which is connected to the positive main switch (SH+, SH1+, SH2+), and the first reference point (50), and/or
the battery system (10) comprises a negative main fuse (43) and a first negative auxiliary voltage divider (45), wherein the negative main fuse (43) is connected between the negative main switch (SH−, SH1−, SH2−) and the first negative terminal (11), wherein
the first negative auxiliary voltage divider (45) comprises a negative main fuse measurement resistor (RHS−) and a negative sub-main fuse measurement resistor (RSHS−) that are connected in series with one another between a first connection of the negative main fuse (43), which is connected to the negative main switch (SH−, SH1−, SH2−), and the first reference point (50).

\* \* \* \* \*